United States Patent
Ismail et al.

(10) Patent No.: US 9,960,790 B2
(45) Date of Patent: May 1, 2018

(54) BELIEF PROPAGATION DECODING FOR SHORT ALGEBRAIC CODES WITH PERMUTATIONS WITHIN THE CODE SPACE

(71) Applicant: KABUSHIKI KAISHA TOSHIBA, Minato-ku (JP)

(72) Inventors: Mohamed Rafiq Ismail, Bristol (GB); Stojan Denic, Bristol (GB)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days. days.

(21) Appl. No.: 15/039,430

(22) PCT Filed: Nov. 29, 2013

(86) PCT No.: PCT/GB2013/053162
§ 371 (c)(1),
(2) Date: May 26, 2016

(87) PCT Pub. No.: WO2015/079193
PCT Pub. Date: Jun. 4, 2015

(65) Prior Publication Data
US 2016/0373136 A1 Dec. 22, 2016

(51) Int. Cl.
*H03M 13/00* (2006.01)
*H03M 13/29* (2006.01)
(Continued)

(52) U.S. Cl.
CPC ........ *H03M 13/2906* (2013.01); *G06N 7/005* (2013.01); *H03M 13/1134* (2013.01);
(Continued)

(58) Field of Classification Search
CPC . H04N 21/236; H04L 27/2627; H04L 1/0057; H04L 27/2647; H04L 27/2655;
(Continued)

(56) References Cited

U.S. PATENT DOCUMENTS

| 7,519,898 B2 | 4/2009 | Narayanan et al. |
| 2005/0229091 A1 | 10/2005 | Narayanan et al. |

(Continued)

FOREIGN PATENT DOCUMENTS

WO  WO 2008/087042 A1  7/2008

OTHER PUBLICATIONS

Juntan Zhang, et al., "Shuffled Iterative Decoding," IEEE Transactions on Communications, vol. 53, No. 2, Feb. 2005, pp. 209-213.
Jing Jiang, et al., "Iterative Soft Decoding of Reed-Solomon Codes," IEEE Communications Letters, vol. 8, No. 4, Apr. 2004, pp. 244-246, XP011112259.

(Continued)

*Primary Examiner* — Guerrier Merant
(74) *Attorney, Agent, or Firm* — Oblon, McClelland, Maier & Neustadt, L.L.P.

(57) ABSTRACT

A method of processing data received over a channel includes receiving data representing probabilities associated with a plurality of variables and receiving a parity check matrix associated with a factor graph which includes variable nodes and check nodes connected by edges. After each exchange of messages between the variable nodes and check nodes, messages are calculated based on messages received at the variable nodes and permuted messages to be sent from the variable nodes in the next iteration are calculated by applying a permutation to the calculated messages. The permutation is of a set of permutations which map each codeword of the set of codewords onto a different codeword of the set of codewords. Soft values associated to variable nodes can be accumulated over two iterations of the message exchange processing.

17 Claims, 9 Drawing Sheets

(51) Int. Cl.
*H03M 13/11* (2006.01)
*G06N 7/00* (2006.01)
*H03M 13/15* (2006.01)

(52) U.S. Cl.
CPC ...... *H03M 13/1191* (2013.01); *H03M 13/611* (2013.01); *H03M 13/1505* (2013.01)

(58) Field of Classification Search
CPC ............................ H04L 27/36; G06F 11/1076; H03M 13/1102; H03M 13/1165; H03M 13/255; H03M 13/618; H03M 13/2778; H03M 13/27; H03M 13/09; H03M 13/2792; H03M 13/036; H03M 13/616; H03M 13/01
See application file for complete search history.

(56) References Cited

U.S. PATENT DOCUMENTS

2009/0271686 A1 10/2009 Jiang et al.
2011/0179333 A1 7/2011 Wesel et al.

OTHER PUBLICATIONS

Thomas R. Halford, et al., "Random Redundant Soft-In Soft-Out Decoding of Linear Block Codes," 2006 IEEE International Symposium on Information Theory, Jul. 9, 2006, pp. 2230-2234, XP031032613.

Ilan Dimnik, et al., "Improved Random Redundant Iterative HDPC Decoding," IEEE Transactions on Communications, vol. 57, No. 7, Jul. 2009, pp. 1982-1985, XP011270559.

Stefan Laendner, et al., "Algorithmic and Combinatorial Analysis of Trapping Sets in Structured LDPC Codes," 2005 IEEE International Conference on Wireless Networks, Communications and Mobile Computing, vol. 1, No. 13, Jun. 2005, pp. 630-635, XP010888030.

International Search Report and Written Opinion of the International Searching Authority dated Mar. 11, 2014 in PCT/GB2013/053162 Filed Nov. 29, 2013.

T. Hehn et al., "Multiple-bases belief-propagation decoding of high-density cyclic codes", Communications, IEEE Transactions on 58(1): 1-8, 2010.

F.J. Mac Williams and N.J.A. Sloane., The theory of Error Correcting Codes. No. V. 1-2 in North-Holland Mathematical Library, North-Holland Publishing Company, 1977 (Textbook).

"BELIEF PROPAGATION DECODING FOR SHORT ALGEBRAIC CODES WITH PERMUTATIONS WITHIN THE CODE SPACE"

FIELD

Embodiments described herein relate generally to methods and decoders for decoding data.

BACKGROUND

Short length messages are routinely exchanged in areas of command and control, features that are fundamental to almost all modern electronic systems. To build reliability into such systems necessitates resilience of the underlying communications infrastructure. During the transfer of data the received data is often corrupted with errors due to noise in the communications system. Alternatively, it is possible for errors to occur in data stored to memory.

In order to help correct any errors, data is often encoded using error correction codes to form a codeword before it is transferred, be that a transferral over a communications channel or to store data over memory. When a corrupted codeword is received, a decoder may be used to correct any errors. Much work, research and implementation, has been done in the area of long channel codes for adding redundancy to multimedia data in the event of impairments; however, little work has been done in the area of developing practical decoding solutions for channel codes in the region of 30-300 bits in length.

BRIEF DESCRIPTION OF DRAWINGS

In the following, embodiments will be described with reference to the accompanying drawings in which.

DETAILED DESCRIPTION

Figure 1:
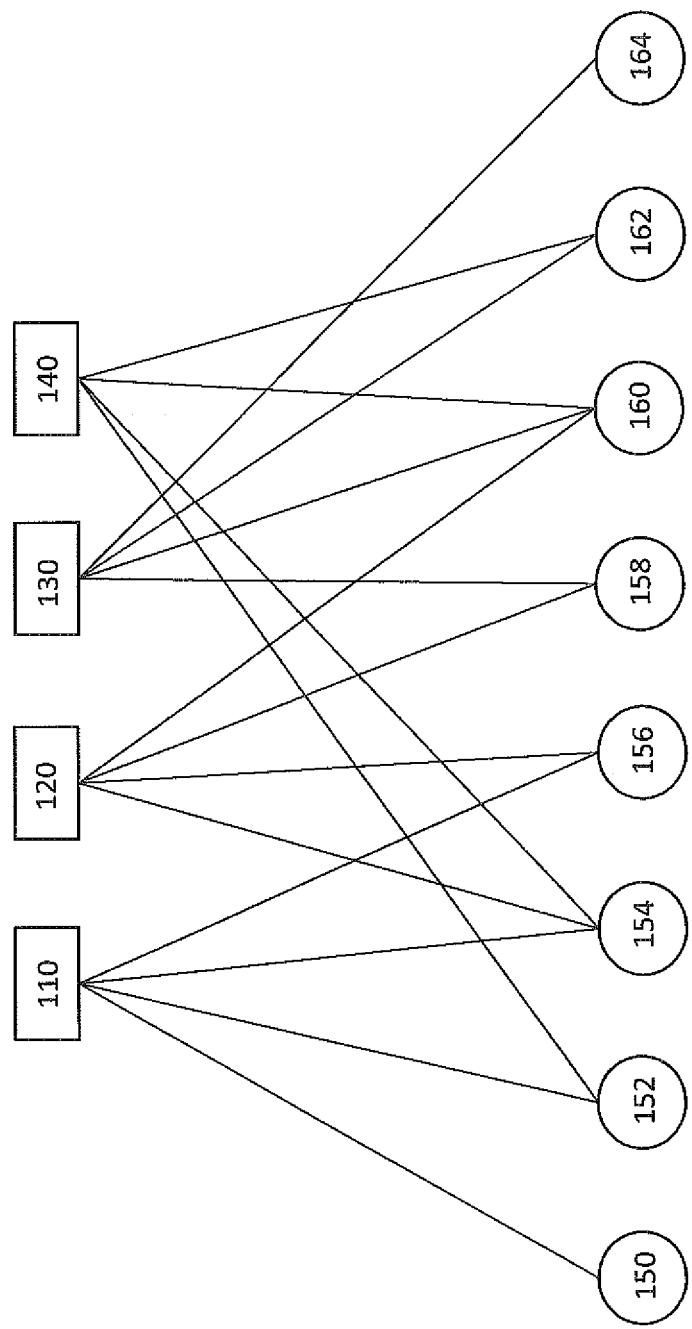
FIG. 1 shows a bipartite graph representing a parity check matrix.

The ability to use effective channel coding on short packet length communications impacts a number of important areas. Most command and control type communication, whether from human-to-machine or machine-to-machine (M2M), is made up of short length packets. As such, any impairment of the message can have disproportionate consequences. For example, in the command and control of remote machinery, such as a satellite or robot, failure in correct communication could be catastrophic. In the area of sensing, such as in smart metering system, the ability to accurately and robustly transmit large numbers of short measurements to a concentrator or server is central to forming an accurate picture of a live system and for billing purposes.

Short packet length data is often encoded using linear algebraic codes, such as Bose-Chandhuri-Hocquenghem (BCH) and Quadratic-Residue (QR) codes. The decoding of linear algebraic codes has historically proved difficult as the complexity of decoding increases as code length increases, even to moderate lengths (e.g. 100-300 bits). Increased computational complexity can result in an increased lag between the receipt of data and its decoding, increased power consumption and the associated requirement for greater processing power in order to process the calculations expediently. A variety of decoding techniques have been developed to counter these computational difficulties.

Minimum Distance Decoding

Codewords are often described as vectors. Given a received vector $\vec{r}$ transferred over a noisy channel may have errors and therefore may not correspond to the codeword $\vec{v}$ which was initially transmitted. The aim of decoding is to determine to a satisfactory probability what this initial codeword $\vec{v}$ was and to recover the original data.

In maximum-likelihood (ML) decoding a received vector $\vec{r}$ is decoded into a codeword $\vec{v}$ such that the conditional probability $P(\vec{r}_{received}|\vec{v}_{sent})$ is maximised, that is, a codeword is chosen such as to maximise the probability that $\vec{r}$ was received given that $\vec{v}$ was sent. For a binary symmetric channel (BSC) this is equivalent to decoding $\vec{r}$ into a codeword $\vec{v}$ such that the Hamming distance, $d(\vec{r},\vec{v})$ between $\vec{r}$ and $\vec{v}$ is minimised. This is called minimum distance or nearest neighbour decoding.

With minimum distance decoding the decoder computes the distance between the received vector $\vec{r}$ and every codeword in C, the linear block code, and then chooses the codeword $\vec{v}$ that is closest to $\vec{r}$, i.e. the codeword for which $d(\vec{r},\vec{v})$ is the smallest, as the decoded codeword. This method of decoding is called complete error correction decoding and requires a total of $2^k$ computations for a codeword of length k. As the received vector $\vec{r}$ is compared to every codeword in C such decoding quickly becomes impractical, even for short codewords. To simplify decoding, incomplete error correction techniques have been developed.

Permutation Decoding

To speed up decoding, a method for decoding cyclic codes has been developed, termed permutation decoding. This technique uses a set of permutations, also referred to as automorphisms, which preserve the code C. Each permutation of the set of permutations is such that, when applied to any codeword of the set of codewords, C, the codeword is mapped onto another valid codeword. Codewords contain information bits, relating to the information represented by the codeword, and additional bits, such as parity or check bits, which are used for decoding. The set of permutations $\{\pi_i\}$ are used to move the bits in error out of the information part of the received codeword.

For a received vector $\vec{r}$ a permuted version $\pi_i \vec{r}$ and the associated syndrome $S_i = H(\pi_i \vec{r})^T$ are calculated, where H is the parity check matrix of the code. For any valid codeword $C_i$, $S_i = HC_i = 0$. The Hamming weight, the number of non-zero symbols, of a syndrome of a received vector or a permuted vector equals the number of erroneous bits in the received vector.

After each permutation, the Hamming weight of the calculated syndrome, $wt(S_i)$ is calculated. Each code C is capable of correcting up to t errors. If C has a minimum distance d with parity check matrix H then it is capable of correcting up to $$t = \frac{d-1}{2}$$

errors.

It can be shown that if the Hamming weight $wt(S_i)$ is less than t then the information bits of the received or permuted vector are correct and the vector can be decoded. Therefore, where the Hamming weight of the syndrome of the received vector is greater than t then there is an error in the information bits and a permutation is applied to the received vector. If the Hamming weight of the syndrome of the permuted vector, $wt(S_i)$, is less than t then the permuted codeword is determined and the correct codeword is decoded by applying the inverse permutation, $\pi_i^{-1}$, to the permuted codeword. If the first permuted vector cannot be decoded as $wt(S_i) \geq t$ then an additional permutation is applied and the process is repeated. Permutations are applied and tested until $wt(S_i) \leq t$ or until a predetermined maximum number of permutations is reached.

The difficulty with permutation decoding is the potentially large size of the set of valid permutations. Thus, alternative decoding techniques have been proposed. Recently, graphical representation of codes has allowed established methods for decoding over graphs to be applied to linear algebraic codes. The algorithms described below are based on iterative soft-in soft-out (SISO) decoding over a bipartite graph representation of the code.

Random Redundant Soft-in Soft-Out Decoding of Linear Block Codes

Soft-in soft-out decoding means that soft information, representing probabilities or reliability, is input and soft information, again representing probabilities, is output. Describing the parity check matrix of a linear block code over a Tanner graph allows for the application of soft-in soft-out decoding algorithms. A linear block code may be, equivalently, defined by a number of different parity check matrices that span the same sub-space. For example, the [8, 4, 4] Hamming code, with 8 coded bits, 4 information bits and a minimum distance of 4, can be defined by the parity check matrices:

$$H_1 = \begin{bmatrix} 1 & 1 & 1 & 1 & 0 & 0 & 0 & 0 \\ 0 & 0 & 1 & 1 & 1 & 1 & 0 & 0 \\ 0 & 0 & 0 & 0 & 1 & 1 & 1 & 1 \\ 0 & 1 & 1 & 0 & 0 & 1 & 1 & 0 \end{bmatrix}$$

$$H_2 = \begin{bmatrix} 0 & 1 & 0 & 1 & 0 & 1 & 0 & 1 \\ 1 & 1 & 0 & 0 & 0 & 0 & 1 & 1 \\ 1 & 0 & 1 & 0 & 1 & 0 & 1 & 0 \\ 0 & 1 & 0 & 1 & 1 & 0 & 1 & 0 \end{bmatrix}$$

Each matrix will have an equivalent redundant Tanner graph. A Tanner graph is a bipartite factor graph depicting the variables which take part in each parity check.

FIG. 1 shows the Tanner graph for the parity check matrix $H_1$ depicted above. Each row of $H_1$ (each of the 4 information bits) is represented by a check node (110, 120, 130, 140). Each column of $H_1$ (each of the 8 coded bits) is represented by a variable node (150-164). For every "1" in $H_1$, a connection is made between the relevant check and variable nodes representing its position in $H_1$. Each connection between check and variable nodes is called an edge. Each edge shows that the relevant variable participates in the parity check corresponding to the check node to which it is connected.

A Tanner graph is wholly determined by its respective parity check matrix, over which the message passing algorithm decodes in an iterative manner. The Tanner graph is commonly represented by a routing network, i.e. a set of wires that connects the two node types. A Tanner graph may alternatively be stored in memory as a set of addresses.

Figure 2:
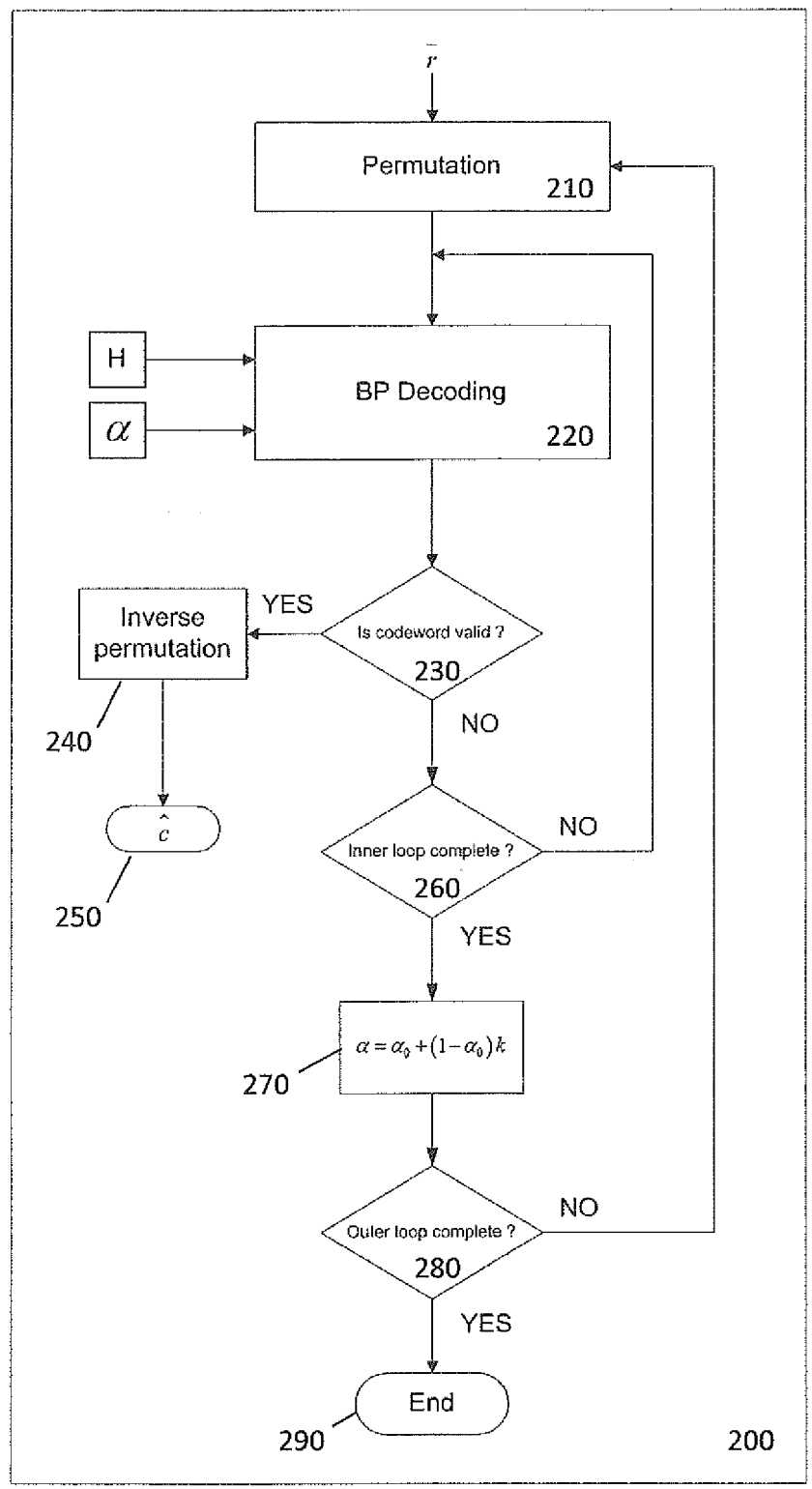
FIG. 2 shows an example of a random redundant decoding (RRD) algorithm.

FIG. 2 shows a functional flow diagram of a random redundant decoding (RRD) algorithm 200. Random redundant decoding is an iterative algorithm which uses the basis of redundant Tanner graphs for effective decoding of arbitrary linear block codes. In this method a belief propagation algorithm is applied to iteratively decode a permuted vector.

Belief propagation is a message passing algorithm which calculates the marginal distribution for each unobserved node conditional on any observed nodes. Messages are passed between nodes. For each edge connected to each node a message is calculated to be sent from the node along the edge. The message to be sent from one variable node along an edge to a check node is the product of all the messages incoming along all other edges connected to said variable node. Accordingly, given a variable node x connected to check nodes A, B and C, the message $\mu_{x \to A}$ to be passed from variable node x to check node A is, $$\mu_{x \to A} = \mu_{B \to x}(x) \cdot \mu_{C \to x}(x)$$

where $\mu_{B \to x}(x)$ and $\mu_{C \to x}(x)$ are incoming messages to variable node x from check nodes B and C.

The message to be sent from each check node along an edge, is the product of the incoming messages along all other edges multiplied by the local function associated with that check node. Accordingly, the message $\mu_{A \to x}$ to be passed from check node A to variable x is, $$\mu_{A \to x} = \sum_{y,z} f_A(x, y, z) \cdot \mu_{y \to A}(y) \cdot \mu_{z \to A}(z)$$

where $\mu_{y \to A}(y)$ and $\mu_{z \to A}(z)$ are incoming messages to check node A from variable nodes y and z and $f_A(x,y,z)$ is the local function associated with check node A.

Each message is transmitted on outgoing edges to further nodes. The probabilities are therefore accumulated as the messages pass from the outer points of the graph, the leaves of the graph, across the graph. This results in a probability distribution for the variable nodes across the whole graph. One round of messages being exchanged between variable and check nodes is one iteration of exchanging messages.

The RRD algorithm takes a received vector of soft information, a parity check matrix representation H of the code and five parameters:

1. $\alpha_0$—initial damping coefficient.
2. $I_1$—number of iterations of the Belief-Propagation (BP) algorithm.
3. $I_2$—maximum number of different permutations that can be applied to each call of the BP algorithm.
4. $I_3$—maximum number of outer iterations, with each outer iteration using a different damping coefficient.
5. Per(C)—set of permutations of the code set.

As shown in FIG. 2, a received vector $\vec{r}$ is initially permuted 210 using one of the set of permutations of the code set Per(C). The permuted vector is then input into a belief propagation algorithm 220. The belief propagation algorithm receives the parity check matrix H and a damping coefficient $\alpha$. The damping coefficient $\alpha$ is initially set to the initial damping coefficient $\alpha_0$ and is applied to the internal variables of the belief propagation algorithm 220. The codeword is tested 230 to see it is valid by calculating the syndrome of the codeword. As discussed above, if the syndrome equals zero then the codeword is valid and the relevant inverse permutation is applied 240 to produce the decoded codeword ĉ which is then output 250.

If the syndrome does not equal zero, the codeword is not valid and the number of iterations of BP decoding is checked 260. If the number of iterations of BP decoding is less than the predefined maximum number of iterations of BP decoding, $I_2$, then BP decoding 220 is repeated with a different permutation applied. In this step, the previous output from belief propagation is permuted using a permutation of the set of permutations Per(C) and the permuted vector is used as the input for a further round of belief propagation decoding.

If the number of iterations of belief propagation reaches the maximum number of iterations $I_2$ without producing a valid codeword, the damping coefficient $\alpha$ is updated 270. The new damping coefficient $\alpha$ is calculated as $$\alpha = \alpha_0 + (1-\alpha_0)\frac{i_3}{(I_3-1)},$$

where $i_3$ is the current iteration number of the outer iterative loop for updating the damping coefficient and $I_3$ is the maximum number of iterations of the outer loop.

The inner iterative loop of permutations and belief propagation decoding is then repeated 280, applying the updated damping coefficient $\alpha$. If a valid codeword has not been obtained after the maximum number of iterations $I_3$ of the outer loop using a different damping coefficient for each iteration then the algorithm ends 290.

By varying the damping coefficient $\alpha$, the RRD algorithm avoids local minima. Therefore, in the case where repeating BP decoding 220 with all $I_2$ permutations doesn't settle on a valid codeword, the permutation loop is repeated with a different damping coefficient $\alpha$ in order to attempt to produce a different, possibly valid, codeword. Naturally, the variation of the damping coefficient requires an additional iterative loop over other methods of decoding which results in increased computational complexity resulting in greater power expenditure and latency during decoding.

Multiple Basis Belief Propagation (MBBP)

Figure 3:
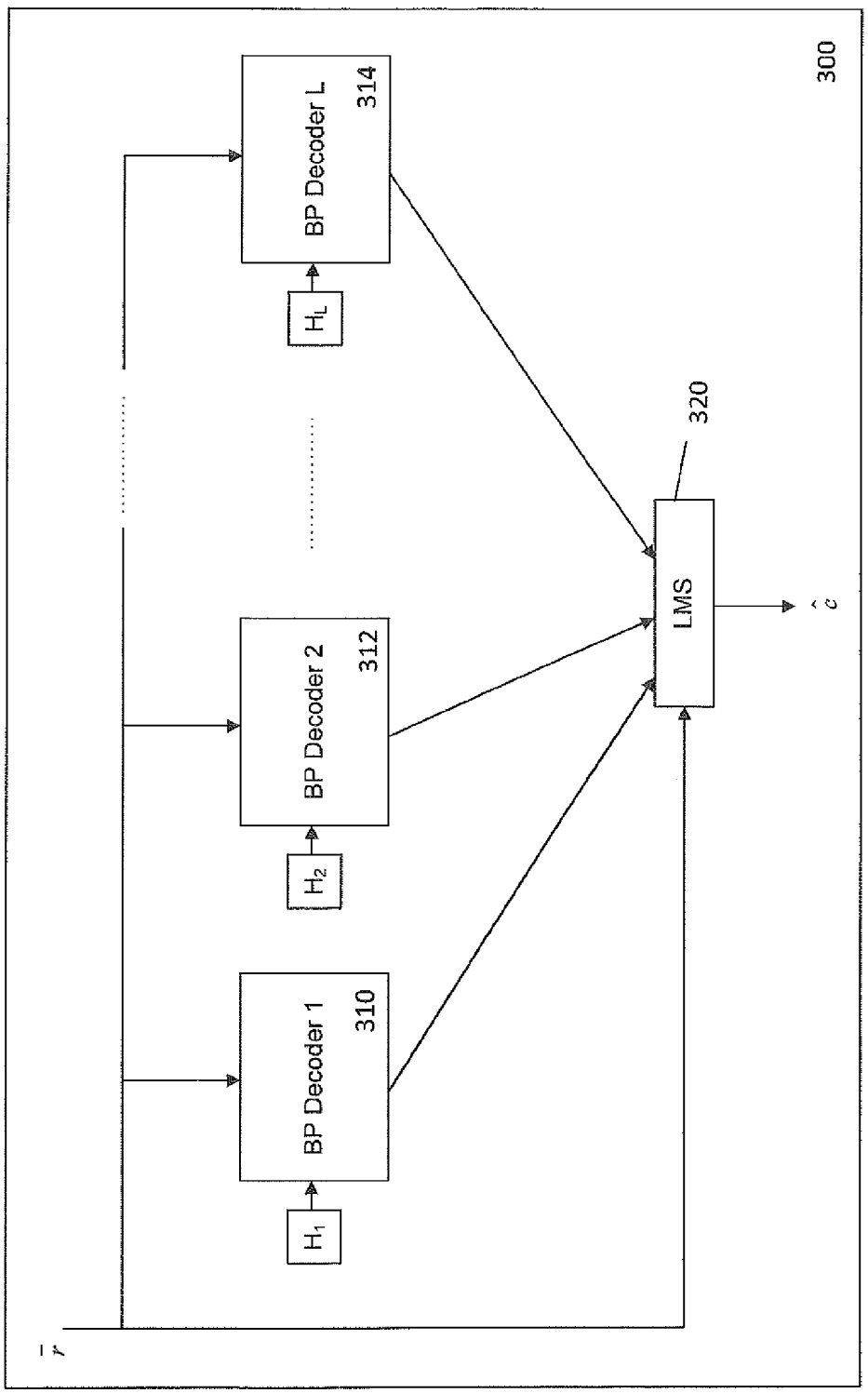
FIG. 3 shows an example of a multiple basis belief propagation (MBBP) algorithm.

FIG. 3 shows an example of a multiple basis belief propagation (MBBP) algorithm 300. MBBP is an alternative iterative SISO decoding algorithm. The standard MBBP algorithm runs multiple BP decoders (310, 312, 314) in parallel. Each BP decoder (310, 312, 314) applies the standard belief propagation algorithm, as described above, without permutations. Each decoder uses a different parity check matrix ($H_1$, $H_2$, $H_L$) as the basis for its belief propagation calculations. On completion of the BP algorithm, if one or more of the BP decoders (310, 312, 314) converged to a valid codeword then the one or more relevant valid codewords are passed on to a least mean selector (LMS) unit 320. If none of the BP decoders (310, 312, 314) converged to a valid codeword then the outputs from all decoders (310, 312, 314) are passed to the LMS unit 320. The LMS unit determines the closest codeword ĉ to the received vector $\vec{r}$ by using the decision rule $$\hat{c} = \arg\max_{v \in V} Pr\{Y = y \mid C = \hat{c}_v\}.$$

Clearly, the use of multiple parallel decoders operating on different parity check matrices is computationally demanding in a practical realisation of the algorithm, requiring a relatively large amount of a system's resources.

Modified Random Redundant Iterative Decoding (mRRD)

Figure 4:
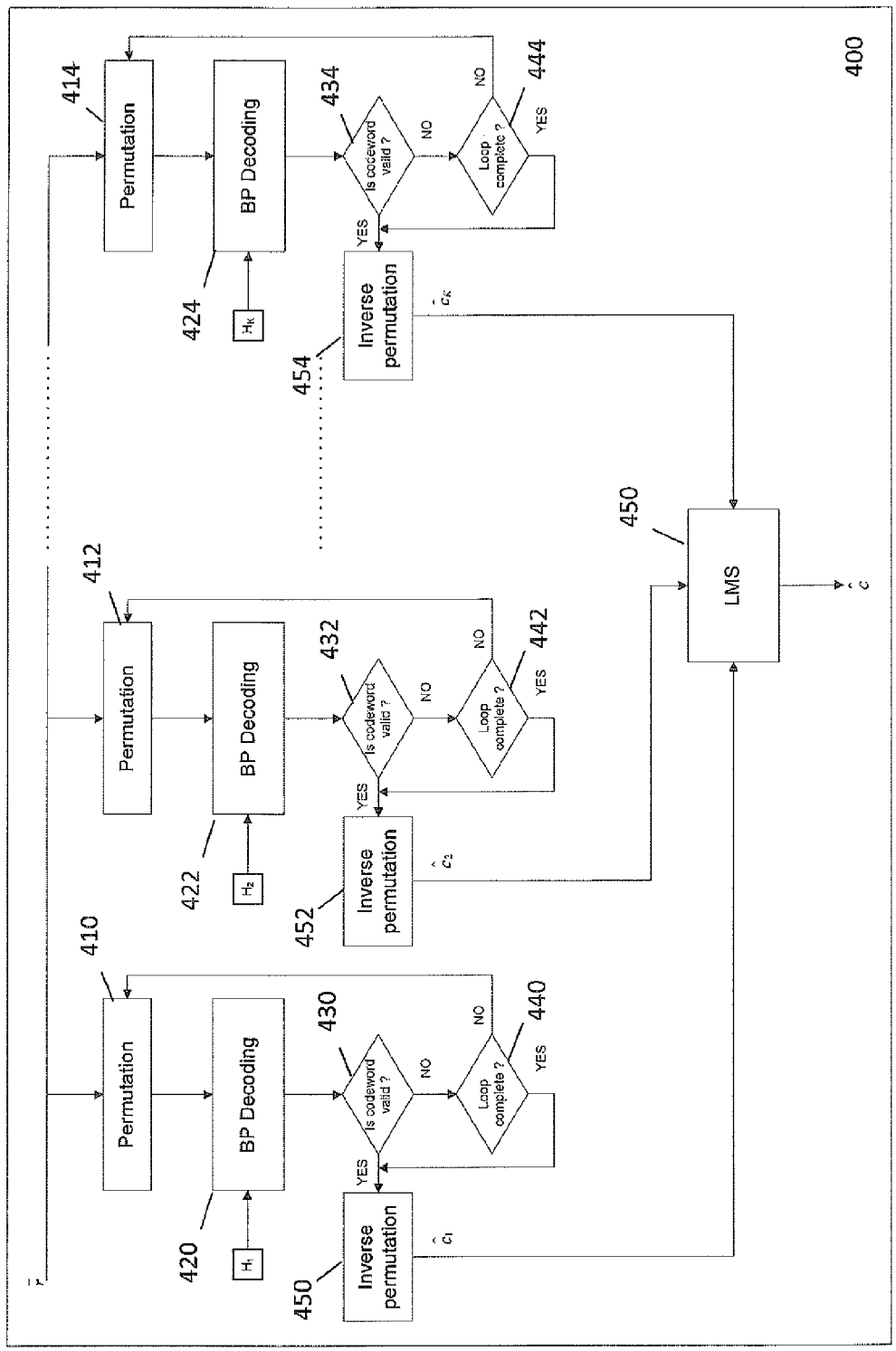
FIG. 4 shows an example of a modified random redundant decoding (mRRD) algorithm.

FIG. 4 shows a flow diagram detailing modified random redundant iterative decoding 400. Modified random redundant iterative decoding (mRRD) combines RRD and MBBP to give some advantages. As in the MBBP algorithm, the mRRD algorithm 400 employs multiple BP decoders; however, unlike the MBBP approach each decoder uses the same parity check matrix, i.e. $H_1=H_2=H_k=H$. Similar to the RRD algorithm, the mRRD algorithm 400 applies a permutation (410, 412, 414) to the received vector $\vec{r}$ before performing BP decoding (420, 422, 424). Each permutation is different for each of the K decoders. The codeword output from each BP decoding algorithm (420, 422, 424) is checked to see if valid (430, 432, 434). If the codeword is not valid then it is checked whether a maximum number of permutation iterations have been completed (440, 442, 444). If the loop isn't complete then BP decoding (420, 422, 424) is repeated with an additional permutation applied (410, 412, 414). If the codeword output from the BP decoding (420, 422, 424) is valid, or if the maximum number of permutation iterations has been reached, then the relevant inverse permutation is applied to the codeword (450, 352, 354) and the decoded codeword ($\hat{c}_1$, $\hat{c}_2$, $\hat{c}_K$) is passed to an LMS unit 450. The LMS unit acts as it does in the MBBP algorithm to determine the closest codeword ĉ to the received vector $\bar{r}$.

The advantage of the mRRD algorithm is the possibility of using multiple parallel decoders, all using the same parity check matrix. Additionally, there is no need to determine a heuristic damping factor $\alpha$, as in the RRD algorithm. By eliminating the step of repeating BP decoding with a variety of damping factors $\alpha$, the algorithms for each BP decoder is computationally less complex than the RRD algorithm.

Having said this, the mRRD algorithm uses a preset number of decoders, K, which run through to completion (either until a valid codeword is found or the preset number of iterations is reached). Only after this point does the LMS unit make a decision on the most likely codeword; therefore, the mRRD algorithm is only as fast as its slowest BP decoder.

In light of the above, it can be seen that there is a need for a simplified method of decoding linear algebraic codes which is less computationally complex and therefore provides more efficient decoding on a device with reduced power consumption.

Permuted Belief Propagation Decoding

According to a first embodiment there is provided a method of processing data received over a channel, the method comprising, at a controller of a decoder, receiving data representing probabilities associated with a plurality of variables of a candidate codeword and receiving a parity check matrix associated with a factor graph and corresponding to a codebook, the codebook comprising a plurality of valid codewords, the factor graph comprising variable nodes, check nodes and edges connecting variable and check nodes. Initial messages to be sent from variable nodes to associated check nodes are calculated based on the received data and messages are iteratively exchanged between variable nodes and check nodes by iterating the following steps. Messages are sent from the variable nodes to associated check nodes. Messages are sent from the check nodes to associated variable nodes based on messages received at the check nodes. After each exchange of messages between the variable nodes and check nodes messages are calculated based on messages received at the variable nodes and permuted messages to be sent from the variable nodes in the next iteration are calculated by applying a permutation to the calculated messages. The permutation is of a set of permutations which map each codeword of the set of codewords onto a different codeword of the set of codewords.

In one embodiment, the received data represents the probability that the variables are specific values. The factor graph may be a representation of the parity check matrix such as a Tanner graph. In one embodiment, the parity check matrix is received by the controller from memory of the decoder, where it is stored. In another embodiment, the parity check matrix is represented as a network of interconnecting wires. In one embodiment, the log likelihood ratios of the received data are calculated and used as the initial messages sent from each variable node for the first iteration of message passing. For each subsequent iteration of message passing, the messages sent the variable nodes comprise the permuted messages to be sent from the variable nodes from the previous iteration of message passing.

In one embodiment, for each iteration, sending messages from the variable nodes comprises for each variable node, sending only a single message to each of its associated check nodes and sending messages from the check nodes comprises for each check node, sending only a single message to each of its associated variable nodes. In other words, for each iteration, only two messages are sent over each edge, one from the respective variable node to the respective check node and one from the respective check node to the respective variable node. In one embodiment, for each iteration, the permutation is applied after each variable node has received only a single message from each of its associated check nodes For each iteration of exchanging messages a different permutation of the set of permutations may be applied. In one embodiment, a random permutation of the set of permutations is chosen for each iteration. In an alternative embodiment, the permutation for each iteration is chosen from the set of permutations based on the number of iterations of message passing which have previously occurred. The permutation applied for each iteration of message passing may be predefined.

In one embodiment, an estimated codeword is calculated based on messages received by the variable nodes. The calculation of an estimated codeword may comprise, after each iteration of exchanging messages, calculating estimates of the variables associated with the variable nodes based on the messages received by the variable nodes. Calculating estimates of the variables may comprise combining the data received for said variable node with messages received from check nodes connected to said variable node.

In one embodiment, calculating an estimated codeword comprises, for subsequent iterations of exchanging messages, combining the current estimate of the variables with permuted estimates of the variables from the previous iteration. The permuted estimates of the variables from the previous iteration may be calculated by applying the permutation applied in the previous iteration to each estimate of the variables from the previous iteration, The validity of the estimated codeword may be tested after a predefined number of iterations of exchanging messages. Testing validity may be by calculating the syndrome of the estimated codeword. The syndrome of the estimated codeword may be calculated by applying the parity check matrix to the estimated codeword. In one embodiment, if a valid codeword is determined, the inverse of all previously applied permutations is applied to the valid codeword to determine a decoded codeword of received data.

In one embodiment, if a valid codeword is not determined after a predetermined number of iterations of exchanging messages, the steps of iteratively exchanging messages are repeated using a different set of permutations. In one embodiment, the steps of iteratively exchanging messages are repeated using the same set of permutations with each iteration applying a random permutation from the set of permutations. In an alternative embodiment, a permutation is applied to the set of permutations and the steps of iteratively exchanging messages are repeated using a the permuted set of permutations.

The disclosure contemplates the provision of a non-transitory computer program product stored on a computer-readable media comprising instructions operative to cause a processor to execute a method according to any of the disclosed embodiments.

According to a further embodiment there is provided a decoder for processing data received over a channel, the decoder comprising a controller configured to receive data representing probabilities associated with a plurality of variables of a candidate codeword and receive a parity check matrix associated with a factor graph and corresponding to a codebook, the codebook comprising a plurality of valid codewords, the factor graph comprising variable nodes, check nodes and edges connecting variable and check nodes. The controller is further configured to calculate initial messages to be sent from variable nodes to associated check nodes based on the received data and iteratively exchange messages between variable nodes and check nodes by iterating the following steps. Sending messages from the variable nodes to associated check nodes. Sending messages from the check nodes to associated variable nodes based on messages received at the check nodes. After each exchange of messages between the variable nodes and check nodes the controller is configured to calculate messages based on messages received at the variable nodes and calculate permuted messages to be sent from the variable nodes in the next iteration by applying a permutation to the calculated messages, wherein the permutation is of a set of permutations which map each codeword of the set of codewords onto a different codeword of the set of codewords.

In one embodiment, for each iteration, sending messages from the variable nodes comprises for each variable node, sending only a single message to each of its associated check nodes and sending messages from the check nodes comprises for each check node, sending only a single message to each of its associated variable nodes.

The controller may be configured to apply a different permutation of the set of permutations for each iteration of exchanging messages.

The decoder may be further configured to calculate an estimated codeword based on messages received by the variable nodes. In one embodiment, calculating an estimated codeword comprises, after each iteration of exchanging messages, calculating estimates of the variables associated with the variable nodes based on the messages received by the variable nodes. Calculating an estimated codeword may comprise, for subsequent iterations of exchanging messages, combining the current estimate of the variables with permuted estimates of the variables from previous iterations.

In one embodiment, the controller is further configured to test the validity of the estimated codeword after a predefined number of iterations of exchanging messages. The controller may be configured to, if a valid codeword is determined, apply to the valid codeword the inverse of all permutations previously applied to determine a decoded codeword of received data. In one embodiment, the controller is configured to, if a valid codeword is not determined after a predetermined number of iterations of exchanging messages, repeat the steps of iteratively exchanging messages using a different set of permutations.

Figure 5A:
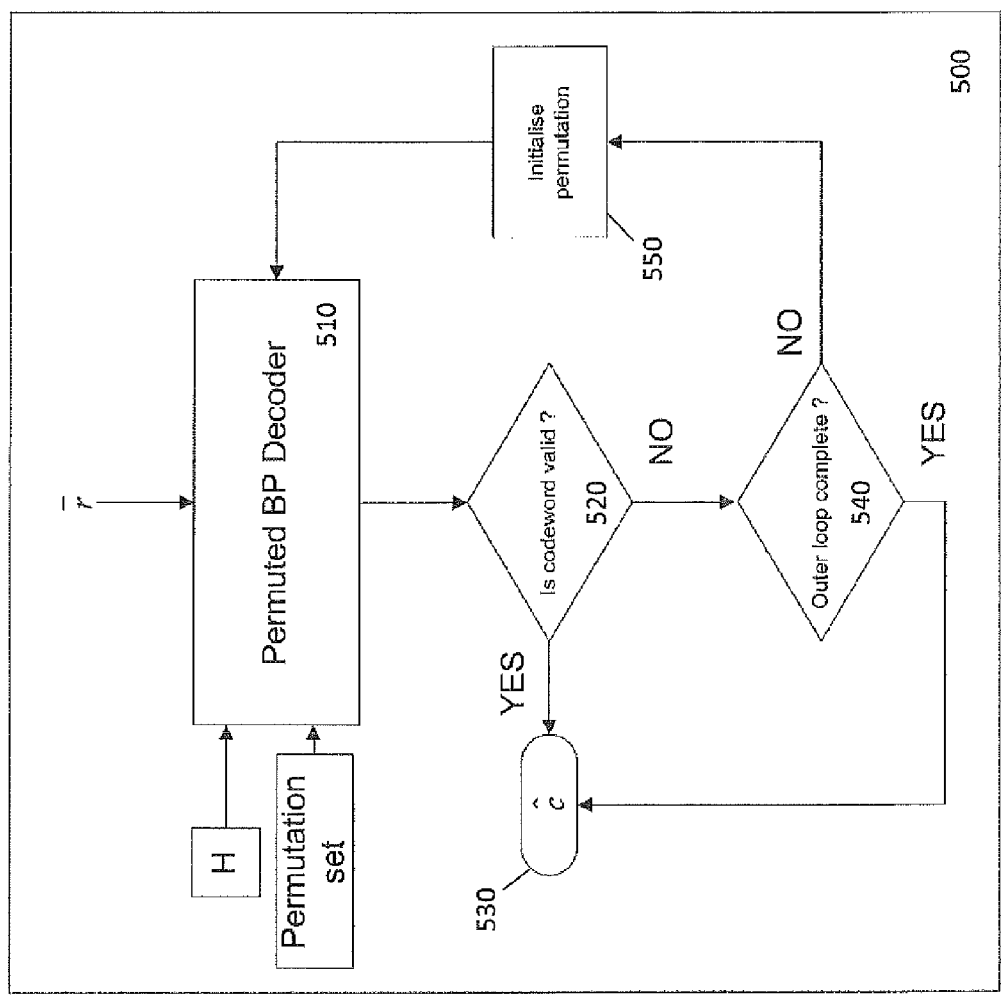
FIG. 5a shows a flow diagram of a decoding method involving a permuted belief propagation algorithm according to a described embodiment.

Embodiments described herein are based on a modification of the belief propagation algorithm. FIG. 5a shows a flow diagram of a decoding method involving a permuted belief propagation algorithm according to a described embodiment. The flow diagram shows the main iterative loop 500 of an embodiment. The main loop 500 consists of a modified belief propagation decoder 510, herein referred to as a permuted belief propagation (PBP) decoder, which takes three inputs: a vector to decode $\bar{r}$, a parity check matrix H and a set of valid permutations.

The parity check matrix H corresponds to a codebook comprising the plurality of valid codewords. The codebook may be predefined. In one embodiment, the codebook is stored in memory in the decoder. In another embodiment, the codebook is transferred to the decoder. The set of valid permutations is an automorphism group of the set of codewords. In other words, each permutation of the set of permutations maps each of the valid codewords onto another valid codeword of the set of codewords. The decoder may calculate the permutations based on the set of valid codewords. Alternatively, the set of permutations may be stored in memory and/or transferred to the decoder.

The vector $\vec{r}$ is a candidate codeword relating to one of a set of valid codewords. The vector to decode $\bar{r}$ is input into the permuted belief propagation algorithm 510. Each component of the vector $\bar{r}$ relates to the probability of an associated variable or bit being a certain value. In one embodiment, the vector comprises log likelihood ratios $LLR_v$ for each transmitted variable, $LLR(r) = \log(P(r=+1|y)/P(r=-1|y))$, where r is the received value and y the transmitted value and the transmitted bits are modulated using binary phase-shift keying (BPSK). That is, the log likelihood ratio for a received value is the logarithm of the probability that the received value is +1 given y was transmitted divided by the probability that the received value is −1 given that y was transmitted. The log likelihood ratios may be calculated by the decoder based on a received signal or may be received from an external source.

A permutation set and a parity check matrix, both relating to the set of codewords being determined, are also input. The permutation set may be stored in memory. The parity check matrix may be stored in memory. In one embodiment, the permutation set and/or the parity check matrix may be received from an external source. In an alternative embodiment, the permutation set is calculated by the decoder itself. This may be done in advance of receiving the data to be decoded or may be done as data is being decoded.

The permuted belief propagation decoder 510 will iteratively decode the vector $\bar{r}$ (see below) and output a codeword. With each iteration of message passing in permuted belief propagation 510 a different permutation of the set of permutations is applied. After permuted belief propagation 510 is complete a decoded codeword is output. The codeword is checked 520 to determine whether it is valid. If the codeword is valid, by virtue of it being orthogonal to the parity check matrix H, the algorithm will output 530 the codeword ĉ and terminate. If the codeword is invalid then it is determined whether the maximum number of iterations set for the outer loop has been reached 540. That is, if the maximum number of repetitions of permuted belief propagation has been reached. The maximum number of repetitions of permuted belief propagation is defined by a predefined threshold which is stored in memory of the device. If the maximum number of iterations for the outer loop has been reached then the current estimation of the codeword is output 530. If the maximum number of iterations for the outer loop has not been reached then the permutation provided to the permuted belief propagation decoder is re-initialised 550 according to the set of permutations provided at the start of the process and the vector to be decoded reset to the received value, $\bar{r}$. The re-initialisation process 550 repeats permutation BP decoding on the received vector $\bar{r}$ applying a different selection of permutations from the set of permutations.

Figure 5B:
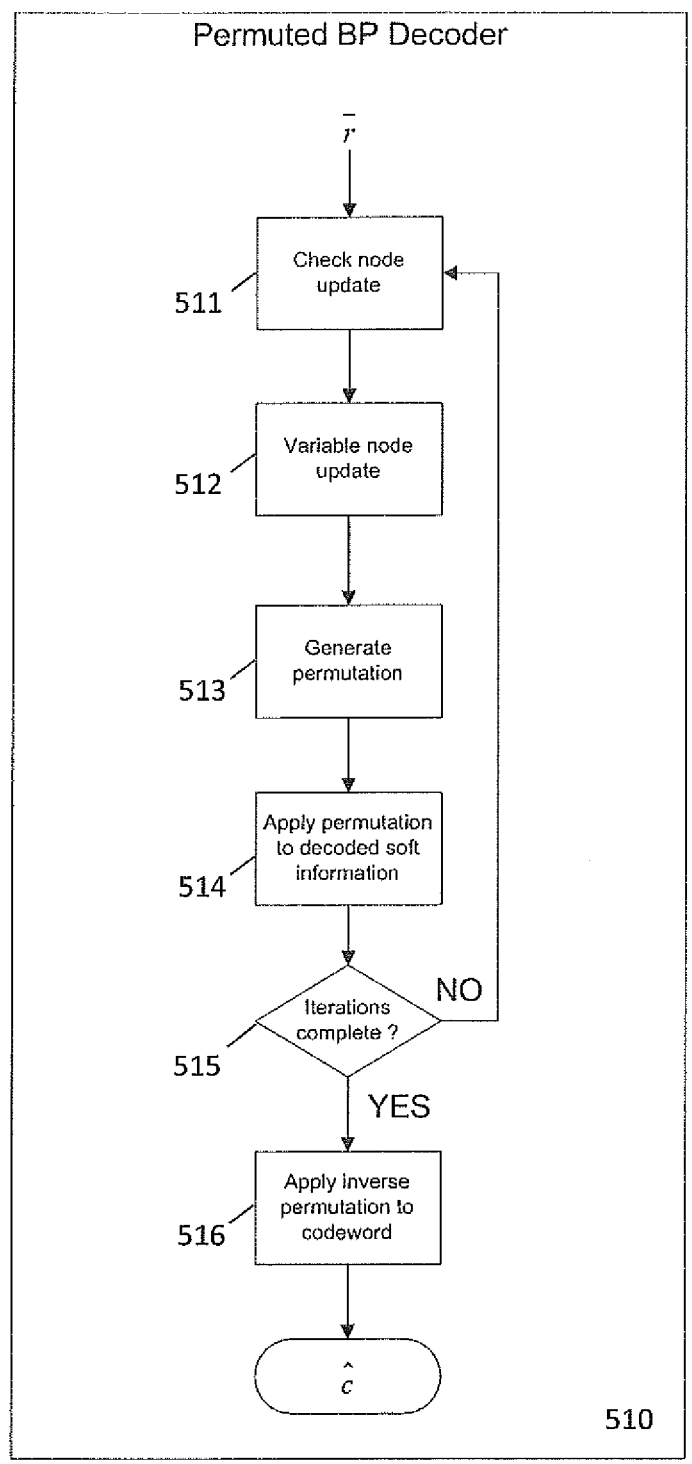
FIG. 5b shows a flow diagram of a permuted belief propagation algorithm according to a described embodiment.

FIG. 5b is a flowchart showing permuted belief propagation decoding 510, in accordance with a described embodiment. An iteration of message passing is a single exchange of messages between all of the check and variable nodes. Therefore, for each iteration of message passing, each edge passes only a single message to its associated check node and only a single message to its associated variable node. The PBP decoder 510 applies a permutation on each iteration of message exchange in the belief propagation process. Therefore, the permuted belief propagation decoder 510 applies a permutation to a cumulative sum of the most recently decoded message and the previously decoded message which is correctly permuted with the previously applied permutation, after each update of the messages being passed between the variable and check nodes. With the exclusion of the additional permutations upon each iteration, the belief propagation algorithm can be a canonical sum-product formulation or one of the many known variants, such as the two-phase message passing or flooding schedule methods.

A controller of the decoder receives the input parity check matrix. In one embodiment, the parity check matrix is received from memory of the decoder. In another embodiment, the parity check matrix is represented as a network of interconnecting wires. The parity check matrix defines the Tanner graph over which the message passing algorithm decodes the received vector. As discussed above, in relation to permutation decoding, the parity check matrix is associated with a codebook such that the matrix product of the parity check matrix with any valid codeword of the codebook equals zero.

Initially, for each variable, messages equal to the log likelihood ratio $LLR_v$ for said variable are passed to the check nodes connected to said variable node. Initialisation of the variable node messages with the LLR values is only performed at the beginning of the iterative procedure, not for each subsequent iteration of the loop. In subsequent iterations, the message passed from variable nodes to check nodes are the messages calculated in the previous iteration based on messages received from the check nodes.

The check nodes are then updated 511. For each check node the decoder calculates the messages to be passed from the check nodes to each variable node to which the respective check nodes are linked based on the messages received at the respective check nodes. The variable nodes are then updated 512. For each variable node, the messages to be sent, in the next iteration, to each check node connected to the variable node are calculated based on the messages received from the attached check nodes.

In addition, for each variable node an estimate of the variable associated with said variable node is updated based on the messages received from the connected check nodes. For each variable node the estimate of the respective variable is calculated by summing all of the incoming messages from connected check nodes with the current estimate for the variable node. The current estimate of the variable node is initialised on the first iteration of message passing as the LLR value initially received for that variable. For subsequent iterations of message passing, the current estimate of the variable (before the estimate is updated for that iteration) is the estimate for the respective variable from the previous iteration of message passing.

An accumulated estimate of the codeword is then calculated by summing each of the estimates of the variables from the present iteration with the estimate of the respective variable from the previous iteration. The estimate of the codeword is a soft value vector. Alternatively, the decoded soft value vector is summed with the input vector $\vec{r}$ if it is the first iteration. For subsequent iterations, the summation accounts for the correct permutation by applying the permutation from the previous iteration to the estimate of the codeword from the previous iteration.

A valid permutation is generated 513 from the automorphism group of the code. In one embodiment a random permutation is selected from the set of permutations. In an alternative embodiment a permutation from the set of permutations is selected based on the number of iterations of the message passing which have previously occurred. The set of permutations may be generated by the decoder or may be stored in memory.

The generated permutation is recorded and applied 514 to the accumulated estimate of the variables $\hat{v}$, i.e. the estimated codeword. The generated permutation is also applied to the set of messages to be passed to the check nodes from each variable node in the next iteration of message passing. In addition, a cumulative permutation Θ is determined by calculating the product of all permutations which have been applied to the estimates $\hat{v}$ and messages in all iterations of message passing.

The decoder then determines whether the maximum number of iterations of message passing has been reached 515. The maximum number of iterations of message passing is defined by a predetermined value stored in memory. If the maximum number of message passing iterations has not been reached, another iteration of message passing is initiated. In the subsequent iteration of message passing, the permuted messages to be passed from the variable nodes to the check nodes are used to update the check nodes 511 and the above process is repeated.

If the maximum number of iterations of message passing has been reached then the decoder applies an inverse permutation 516, based on the cumulative permutation Θ, to the soft value vector $\hat{v}$, the accumulated estimate of the variables, and returns a decoded codeword $\hat{c}$. A hard decision, i.e. a determination of whether each variable of the decoded codeword is a "0" or a "1", may be made after the inverse permutation is applied in order to output a quantized codeword $\hat{c}$. In an alternative embodiment, the inverse permutation is applied to a hard representation $\hat{v}_{hard}$ of the soft value vector $\hat{v}$ calculated from the final iteration of the permuted belief propagation.

As shown in FIG. 5a, codeword $\hat{c}$ is tested for validity 520. If the codeword $\hat{c}$ output from the permuted belief propagation decoder 510 is not valid and the maximum number of iterations of permuted belief propagation has not been reached, then permuted belief propagation is repeated. If the permuted belief propagation decoder selects a random permutation of the permutation set when generating the permutation, then permuted belief propagation 510 is merely repeated with the same inputs as previously. In an alternative embodiment, the permuted BP decoder generates permutations in an ordered fashion, cycling through the set of permutations with each iteration of message passing. In this embodiment, initialising the permutations 550 comprises selecting a new subset of permutations or a new initial permutation for the first iteration of message passing. In an alternative embodiment, initialising the set of permutations 550 comprises applying a permutation to the initial set of permutations.

In one embodiment, the validity of the estimated codeword is tested periodically during permuted BP decoding 510. In one embodiment, the validity of the codeword is determined for every iteration of message passing. Each time the check and variable nodes have been updated once, a syndrome calculation may be done to check if the decoded codeword is valid. If the codeword is valid, the inverse of any permutations which have been applied so far is applied to the estimated codeword and a decoded codeword $\hat{c}$ is output. In FIG. 5b, for clarity, this step is not shown. In an alternative embodiment, the validity of the estimated codeword is only tested after the maximum number of iterations of permuted belief propagation has been reached.

One embodiment of permutation BP decoding 510 shall now be described. Let the parity check matrix H of a linear block code consist of M parity check equations on N codeword bits. The parity check matrix may be represented by a bipartite graph consisting of variable nodes corresponding to the received bits and check nodes corresponding to the parity checks. The non-zero entries in the parity check matrix indicate a connection between a parity check node (row) and variable node (column). The modified message passing algorithm according to a described embodiment is described as follows:

1) Initialise: Set the N variable node values, V, with the received log likelihood ratio values, $LLR_v$. For all $h_{ij}=1$ in H, where i∈M, j∈N, let $LLR_{vc}=LLR_v$, $\hat{v}=\hat{v}_{prev}=LLR_v$, θ(0)=I, where I is the identity permutation and, where $\hat{v}_{prev}$ is the estimate of the codeword $\hat{v}$ calculated in the previous iteration of message passing. Let S be the automorphism group of the linear code C.

2) Update from check nodes: Calculate the update messages to be sent from each of the M check nodes as:

$$LLR_{cv} = 2\tanh^{-1}\left(\prod_{v' \in V_c \setminus \{v\}} \tanh\left(\frac{1}{2}LLR_{v'c}\right)\right)$$

where v'∈$V_c$\{v} means all nodes in the set $V_c$ except node v.

3) Update from variable nodes: Calculate the update messages to be sent from each of the N variable nodes as:

$$LLR_{vc} = \sum_{c' \in C_v \setminus \{c\}} LLR_{c'v}$$

where c'∈$C_v$\{c} means all nodes in the set $C_v$ except node c.

4) Form bit estimate: For each of the N variable nodes form an estimate of the associated bit by summing the incoming messages with the previous soft output $\hat{v}$:

$$\hat{v} = \hat{v} + \sum_{c \in C_v} LLR_{cv}$$

5) Accumulate: Apply permutation to previous soft output and add to current soft output before setting $\hat{v}_{prev}$ to $\hat{v}$ to enable its use in the following iteration of message passing:

$$\hat{v} = \hat{v} + Per(\hat{v}_{prev}, \theta)$$

$$\hat{v}_{prev} = \hat{v}$$

6) Permute: Generate a random permutation from the automorphism group of the code and apply to soft values and variable node values. Update the cumulative set of permutations, Θ:

θ←random group element of S $\hat{v}$=Per($\hat{v}$,θ)

$LLR_{vc}$=Per($LLR_{vc}$,θ)

Θ=θΘ

7) Termination: For each of the N variable nodes, form a hard decision as follows:

$$\hat{v}_{hard} = \begin{cases} 1 & \text{if } \hat{v} < 0 \\ 0 & \text{otherwise} \end{cases}$$

If $\hat{v}_{hard}$H=0 or the maximum number of permitted iterations is reached then terminate the decoding procedure and output the decoded codeword ĉ by applying the inverse of the cumulative set of permutations, $\Theta^{-1}$, to the current soft output:

$$\hat{c} = \Theta^{-1}\hat{v}$$

Otherwise, execute an additional iteration of message passing by repeating steps 2-7.

Inclusion of the permutation within the BP algorithm is a novel feature, hitherto unseen in the literature. By applying a permutation to the messages to be passed between the variable and check nodes for each iteration of message passing, embodiments may provide a more efficient decoding scheme which speeds up decoding and requires fewer resources to process.

Whilst the above embodiments apply permutations after each exchange of messages between variable and check nodes, embodiments may equally be described as applying the permutations before each exchange of messages. Whilst the above embodiment tests the validity of the hard codeword, $\hat{v}_{hard}$ after each iteration of message passing by calculating the syndrome, in alternative embodiments the validity of the codeword is only tested after a predetermined number of iterations of message passing. In a further embodiment, the hard output is only calculated, and the validity of the hard output is only tested after the maximum number of permitted iterations has been reached.

Whilst the above embodiment outputs a soft value for the decoded codeword ĉ by applying the inverse of the cumulative set of permutations to the soft estimate $\hat{v}$, in an alternative embodiment, the codeword ĉ is a hard codeword calculated by applying the inverse of the cumulative set of permutations, $\Theta^{-1}$, to the hard estimate $\hat{v}_{hard}$.

Permuted belief propagation decoding is of particular interest when used in the decoding of codes over graphs. Linear algebraic codes, such as Bose-Chandhuri-Hocquenghem (BCH) and Quadratic-Residue (QR) codes are challenging to decode for relatively large block lengths (100-300 bits) using non-iterative methods. Thus, iterative techniques such as the RRD, mRRD and MBBP algorithms have been adopted and their error correcting performance has been shown to approach the Maximum-Likelihood (ML) performance.

Embodiments described herein remove the need for a heuristic damping factor as needed in the RRD algorithm. Consequently, this results in the removal of the inner loop used for modifying the damping factor. This has the effect of reducing the number of overall iterations of the BP algorithm. Unlike the mRRD algorithm, embodiments described herein do not use multiple decoders; consequently, a decision block at the completion of the decoding to decide on the most likely codeword is not needed. This results in reduced hardware costs, and decoding which is faster and more efficient and which therefore has reduced power requirements. Accordingly, the decoding algorithm may be implemented on less powerful devices and on devices with a reduced or limited power supply.

Figure 6:
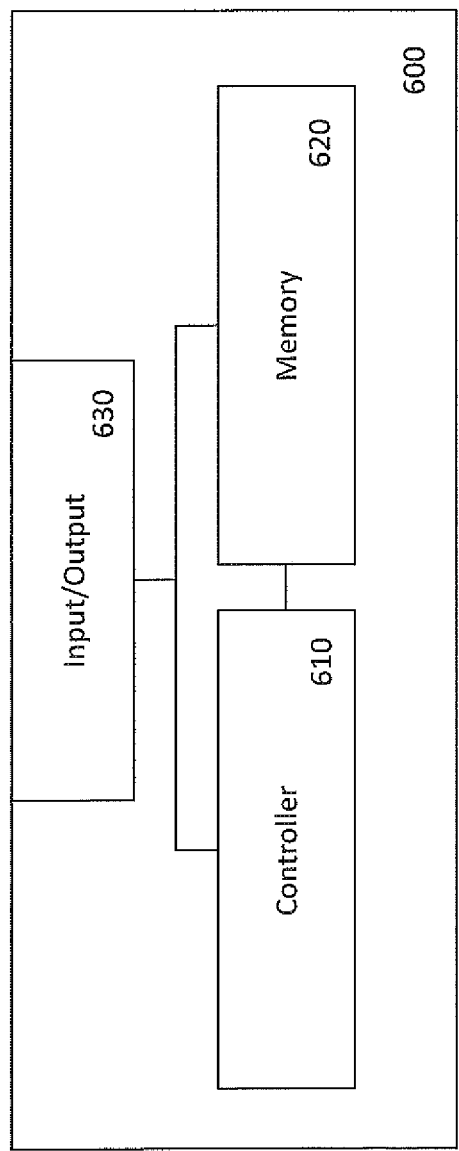
FIG. 6 shows a decoder 600 in accordance with a described embodiment.

FIG. 6 shows a decoder 600 in accordance with a described embodiment. The decoder 600 comprises a controller 610, memory 620 and an input/output interface 630. The controller 610 is configured to process data received at the input/output interface 630 in accordance with executable code stored in the memory 620. In one embodiment, the memory 620 stores a set of parity check matrices. In an alternative embodiment, the codebook is received by the device at the input/output interface 630

Figure 7:
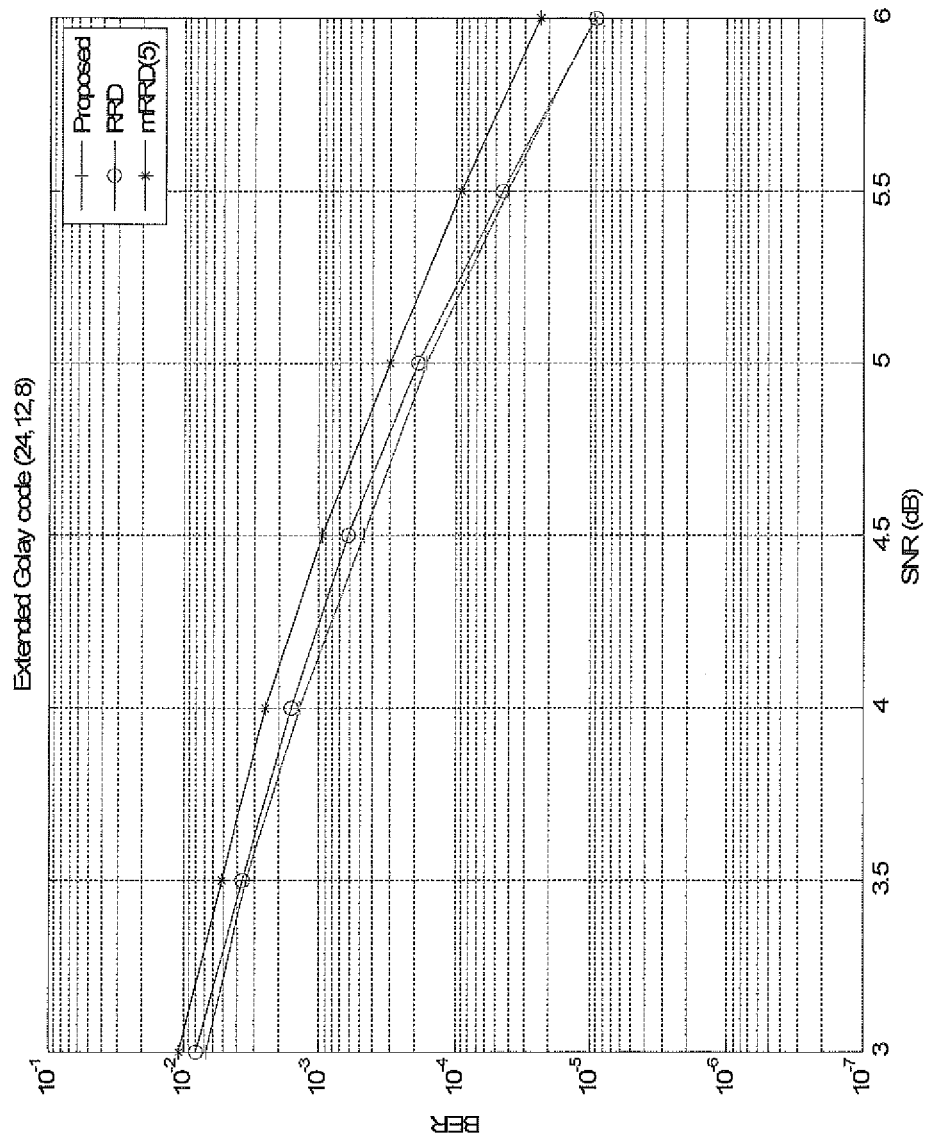
FIG. 7 shows the Bit Error Rate (BER) for a described embodiment, a random redundant decoding (RRD) algorithm and a modified random redundant iterative decoding (mRRD) algorithm.

FIG. 7 shows the Bit Error Rate (BER) for a described embodiment, the RRD algorithm and the mRRD algorithm (with 5 decoders) on the (24,12,8) Extended Golay code. BER performance for the embodiment exceeds the RRD algorithm and mRRD algorithms.

Figure 8:
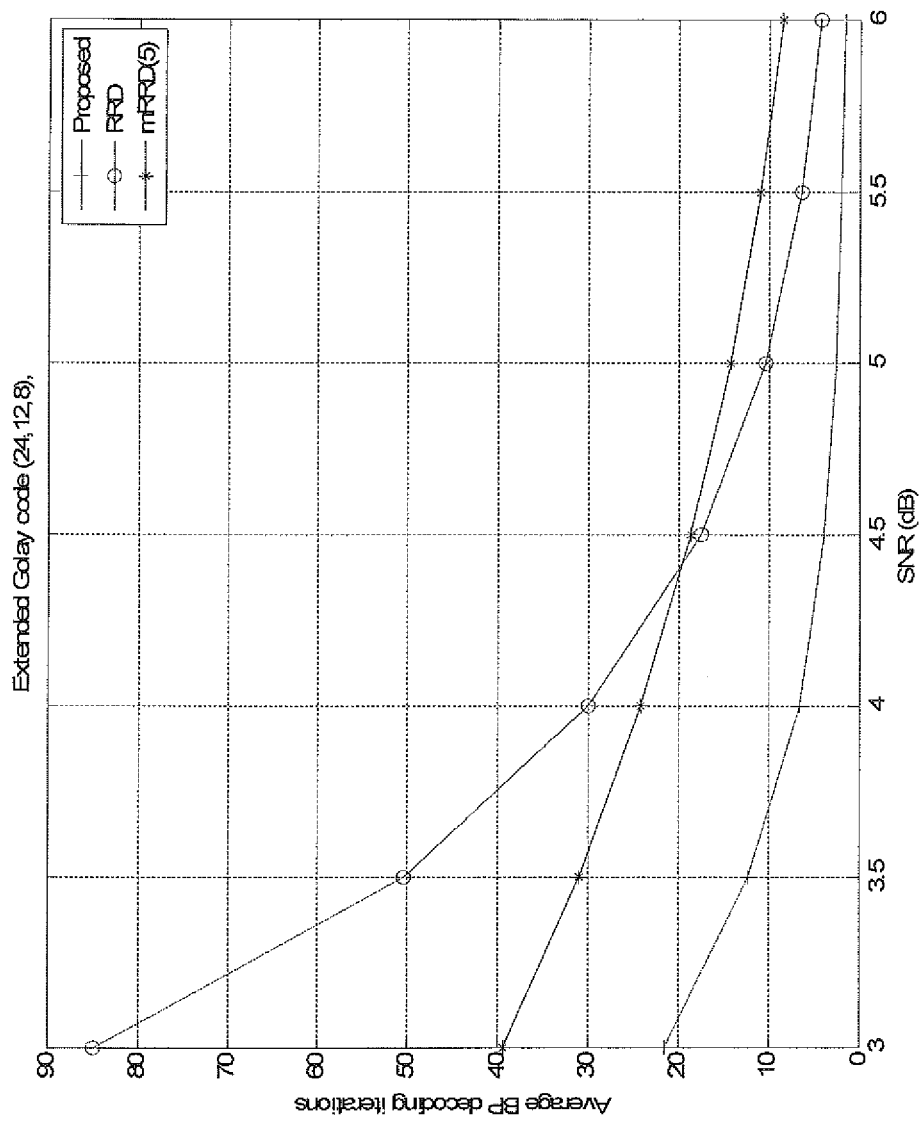
FIG. 8 shows the average number of iterations of a described embodiment, the RRD algorithm and the mRRD algorithm.

FIG. 8 shows the average number of iterations of the BP algorithm used by a described embodiment, the RRD algorithm and the mRRD algorithm (with 5 decoders) on the (24,12,8) Extended Golay code. The embodiment is shown to use significantly fewer iterations of the BP decoder than either the RRD or the mRRD algorithms.

Practical decoding of linear algebraic codes has always been a challenging area spawning sub-optimal, iterative techniques more amenable to practical decoding. Embodiments may provide improved performance to alternative algorithms for decoding of linear algebraic codes whilst having significantly lower complexity.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

The invention claimed is:

1. A method for determining content from potentially corrupted data, the method comprising, at a controller:
   receiving data representing probabilities associated with a plurality of variables of a candidate codeword;
   receiving a parity check matrix associated with a factor graph and corresponding to a codebook, the codebook comprising a plurality of valid codewords, the factor graph comprising variable nodes, check nodes and edges connecting variable and check nodes;
   calculating initial messages to be sent from variable nodes to associated check nodes based on the received data; and
   iteratively exchanging messages between variable nodes and check nodes by iterating the following steps:
      sending messages from the variable nodes to associated check nodes;
      sending messages from the check nodes to associated variable nodes based on messages received at the check nodes; and
      after each exchange of messages between the variable nodes and check nodes:
         calculating messages based on messages received at the variable nodes; and
         calculating permuted messages to be sent from the variable nodes in the next iteration by applying a permutation to the calculated messages, wherein the permutation is of a set of permutations which map each codeword of the set of codewords onto a different codeword of the set of codewords;
      calculating an estimated codeword based on messages received by the variable nodes;
      applying to the estimated codeword the inverse of all permutations previously applied to determine content of the received data; and
   outputting the content.

2. The method of claim 1 wherein for each iteration:
   sending messages from the variable nodes comprises for each variable node, sending only a single message to each of its associated check nodes; and
   sending messages from the check nodes comprises for each check node, sending only a single message to each of its associated variable nodes.

3. The method of claim 1, wherein for each iteration of exchanging messages a different permutation of the set of permutations is applied.

4. The method of claim 1 wherein, calculating an estimated codeword comprises, after each iteration of exchanging messages, calculating estimates of the variables associated with the variable nodes based on the messages received by the variable nodes.

5. The method of claim 4 wherein, calculating an estimated codeword comprises, for subsequent iterations of exchanging messages, combining the current estimate of the variables with permuted estimates of the variables from previous iterations.

6. The method of claim 1 further comprising testing the validity of the estimated codeword after a predefined number of iterations of exchanging messages.

7. The method of claim 6, wherein the inverse of all permutations previously applied is applied to the valid codeword in response to a determination that the codeword is valid.

8. The method of claim 6 further comprising, if a valid codeword is not determined after a predetermined number of iterations of exchanging messages, repeating the steps of iteratively exchanging messages using a different set of permutations.

9. A non-transitory computer program product stored on a computer-readable media comprising instructions operative to cause a processor to execute a method according to claim 1.

10. A system for determining content from potentially corrupted data, the system comprising a controller configured to:
    receive data representing probabilities associated with a plurality of variables of a candidate codeword;
    receive a parity check matrix associated with a factor graph and corresponding to a codebook, the codebook comprising a plurality of valid codewords, the factor graph comprising variable nodes, check nodes and edges connecting variable and check nodes;
    calculate initial messages to be sent from variable nodes to associated check nodes based on the received data; and
    iteratively exchange messages between variable nodes and check nodes by iterating the following steps:
       sending messages from the variable nodes to associated check nodes;
       sending messages from the check nodes to associated variable nodes based on messages received at the check nodes; and
       after each exchange of messages between the variable nodes and check nodes:
          calculating messages based on messages received at the variable nodes; and
          calculating permuted messages to be sent from the variable nodes in the next iteration by applying a permutation to the calculated messages,
       wherein the permutation is of a set of permutations which map each codeword of the set of codewords onto a different codeword of the set of codewords;
       calculating an estimated codeword based on messages received by the variable nodes;
       applying to the estimated codeword the inverse of all permutations previously applied to determine content of the received data; and
    outputting the content.

11. The system of claim 10 wherein, for each iteration:
    sending messages from the variable nodes comprises for each variable node, sending only a single message to each of its associated check nodes; and
    sending messages from the check nodes comprises for each check node, sending only a single message to each of its associated variable nodes.

12. The system of claim 10, wherein the controller is configured to apply a different permutation of the set of permutations for each iteration of exchanging messages.

13. The system of claim 1 wherein, calculating an estimated codeword comprises, after each iteration of exchanging messages, calculating estimates of the variables associated with the variable nodes based on the messages received by the variable nodes.

14. The system of claim 13 wherein, calculating an estimated codeword comprises, for subsequent iterations of exchanging messages, combining the current estimate of the variables with permuted estimates of the variables from previous iterations.

15. The system of claim 1 wherein the controller is further configured to test the validity of the estimated codeword after a predefined number of iterations of exchanging messages.

16. The system of claim 15 wherein, the inverse of all permutations previously applied is applied to the valid codeword in response to a determination that the codeword is valid.

17. The system of claim 15 wherein the controller is configured to, if a valid codeword is not determined after a predetermined number of iterations of exchanging messages, repeat the steps of iteratively exchanging messages using a different set of permutations.

* * * * *